US012055775B2

(12) United States Patent
Cheng et al.

(10) Patent No.: US 12,055,775 B2
(45) Date of Patent: Aug. 6, 2024

(54) OPTICAL TRANSCEIVER HOUSING WITH INTEGRATED VAPOR CHAMBER AND AN OPTICAL TRANSCEIVER MODULE IMPLEMENTING SAME

(71) Applicant: Applied Optoelectronics, Inc., Sugar Land, TX (US)

(72) Inventors: Hao-Chiang Cheng, Houston, TX (US); Kai-Sheng Lin, Sugar Land, TX (US); Kevin Liu, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 250 days.

(21) Appl. No.: 17/712,807

(22) Filed: Apr. 4, 2022

(65) Prior Publication Data

US 2023/0314736 A1   Oct. 5, 2023

(51) Int. Cl.
*G02B 6/42* (2006.01)
*H05K 7/20* (2006.01)

(52) U.S. Cl.
CPC ......... *G02B 6/4256* (2013.01); *G02B 6/4246* (2013.01); *G02B 6/4269* (2013.01); *G02B 6/428* (2013.01); *H05K 7/20318* (2013.01)

(58) Field of Classification Search
None
See application file for complete search history.

(56) References Cited

U.S. PATENT DOCUMENTS

| 10,667,432 | B2 * | 5/2020 | Sutherland | H05K 7/20463 |
|---|---|---|---|---|
| 11,454,774 | B2 * | 9/2022 | Hsiao | H01R 13/66 |
| 2005/0095901 | A1 * | 5/2005 | Miller | G02B 6/4272 439/485 |
| 2019/0182985 | A1 * | 6/2019 | Gaviola | H05K 7/20409 |
| 2019/0387642 | A1 * | 12/2019 | Toleno | G06F 1/203 |
| 2021/0072473 | A1 * | 3/2021 | Wall, Jr. | H05K 1/0274 |
| 2021/0105025 | A1 * | 4/2021 | Wall, Jr. | H04B 1/3827 |
| 2022/0416898 | A1 * | 12/2022 | Kung | G02B 6/4272 |
| 2023/0314736 | A1 * | 10/2023 | Cheng | G02B 6/4246 361/700 |

OTHER PUBLICATIONS

Vapor Chamber, celsia—Making Hot Technology Cooler, Copyright—Celsia Inc. 2004-2022, 11 pgs.
Vapor Chambers, Cofan USA, Cofan USA, Inc. 2021, 4 pgs.

* cited by examiner

*Primary Examiner* — Rhonda S Peace
(74) *Attorney, Agent, or Firm* — Grossman Tucker Perreault & Pfleger, PLLC; Norman S. Kinsella

(57) ABSTRACT

The present disclosure is generally directed to an optical transceiver housing for use in an optical transceiver module with at least one vapor chamber integrated into the transceiver housing. In more detail, the transceiver housing includes at least first and second housing portions on opposite sides and forming a compartment defined by one or more inner surfaces therein. The vapor chamber includes a heat input side and a heat output side on opposite sides of the vapor chamber. An outer wall of at least one of the housing portions may be defined at least in part by the heat output side of the vapor chamber such that the heat output side is exposed to outside of the transceiver housing for transferring heat from inside to outside the optical transceiver module.

13 Claims, 8 Drawing Sheets

OPTICAL TRANSCEIVER HOUSING WITH INTEGRATED VAPOR CHAMBER AND AN OPTICAL TRANSCEIVER MODULE IMPLEMENTING SAME

TECHNICAL FIELD

The present disclosure relates to optical transmitters and transceivers, and more particularly, to an optical transceiver housing with an integrated vapor chamber.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

The data center market for optical transceivers continues to grow, as well as increased demand in ever-increasing transmission speeds. Recent standards have now enabled wide-spread development of optical transmitters and transceivers capable of reaching speeds of 400 Gb/s (commonly known as 400 G). Transceiver modules continue to scale to meet market demand, but such scaling raises significant design and manufacturing challenges with respect to the thermal management.

SUMMARY

Consistent with an aspect of the present disclosure, a transceiver housing includes a housing body including at least first and second housing portions on opposite sides of the housing body and extending along a first major axis from a first end to a second end, and forming a compartment defined by one or more inner surfaces therein. The transceiver housing also includes at least one integrated vapor chamber integrated with at least one of the housing portions, the integrated vapor chamber including a heat input side and a heat output side on opposite sides of the vapor chamber. An outer wall of at least one of the housing portions is defined at least in part by the heat output side of the vapor chamber such that the heat output side is exposed to outside the housing body.

Consistent with another aspect of the present disclosure, an optical transceiver module includes a transceiver housing, including a transceiver optical connection end and a transceiver electrical connection end, the transceiver optical connection end of the transceiver housing being configured to provide an optical connection and the transceiver electrical connection end of the transceiver housing being configured to provide an electrical connection. The optical transceiver module also includes a transmitter optical subassembly (TOSA) located in the transceiver housing, the TOSA being configured to transmit optical signals, a receiver optical subassembly (ROSA) located in the transceiver housing, the ROSA being configured to receive optical signals, and a circuit board located in the transceiver housing and electrically connected to the TOSA and to the ROSA. The transceiver housing includes at least first and second housing portions on opposite sides of the transceiver housing and extending along a first major axis from a first end to a second end, and forming a compartment defined by one or more inner surfaces therein. The transceiver housing further includes at least one vapor chamber integrated with at least one of the first and second housing portions such that a heat input side of the vapor chamber is proximate at least one heat generating component inside the transceiver housing and a heat output side of the vapor chamber is exposed to outside the transceiver housing.

BRIEF DESCRIPTION OF THE DRAWINGS

These and other features and advantages will be better understood by reading the following detailed description, taken together with the drawings wherein.

DETAILED DESCRIPTION

The present disclosure is generally directed to an optical transceiver housing for use in an optical transceiver module with a vapor chamber integrated into the transceiver housing. In more detail, the transceiver housing comprises a housing body and the integrated vapor chamber. The housing body includes at least first and second housing portions on opposite sides of the housing body and extending along a first major axis from a first end to a second end, and forms a compartment defined by an inner surface therein. The vapor chamber includes a heat input side and a heat output side on opposite sides of the vapor chamber for conducting heat from inside the housing to outside the housing. An outer wall of at least one of the housing portions may be defined at least in part by the heat output side of the vapor chamber such that the heat output side of the vapor chamber is exposed to outside of the transceiver module. The vapor chamber may be integrated into the transceiver housing by, e.g., overmolding with the housing body. The optical transceiver housing may thus provide improved thermal characteristics and a reduced size.

As used herein, "thermally coupled" refers to a direct or indirect connection or contact between two components resulting in heat being conducted from one component to the other component. As used herein, "vapor chamber" refers to a device that is configured to transfer heat by vaporizing and condensing a working fluid inside a chamber of the device.

Figure 1A:
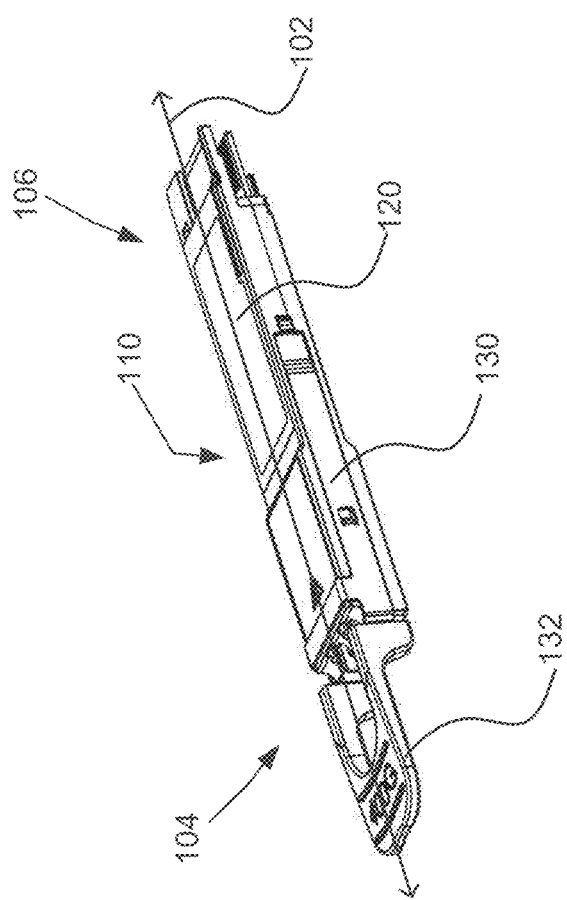
FIG. 1A is a perspective view of a pluggable optical transceiver module with an integrated vapor chamber, in accordance with an embodiment of the present disclosure.
Figure 1B:
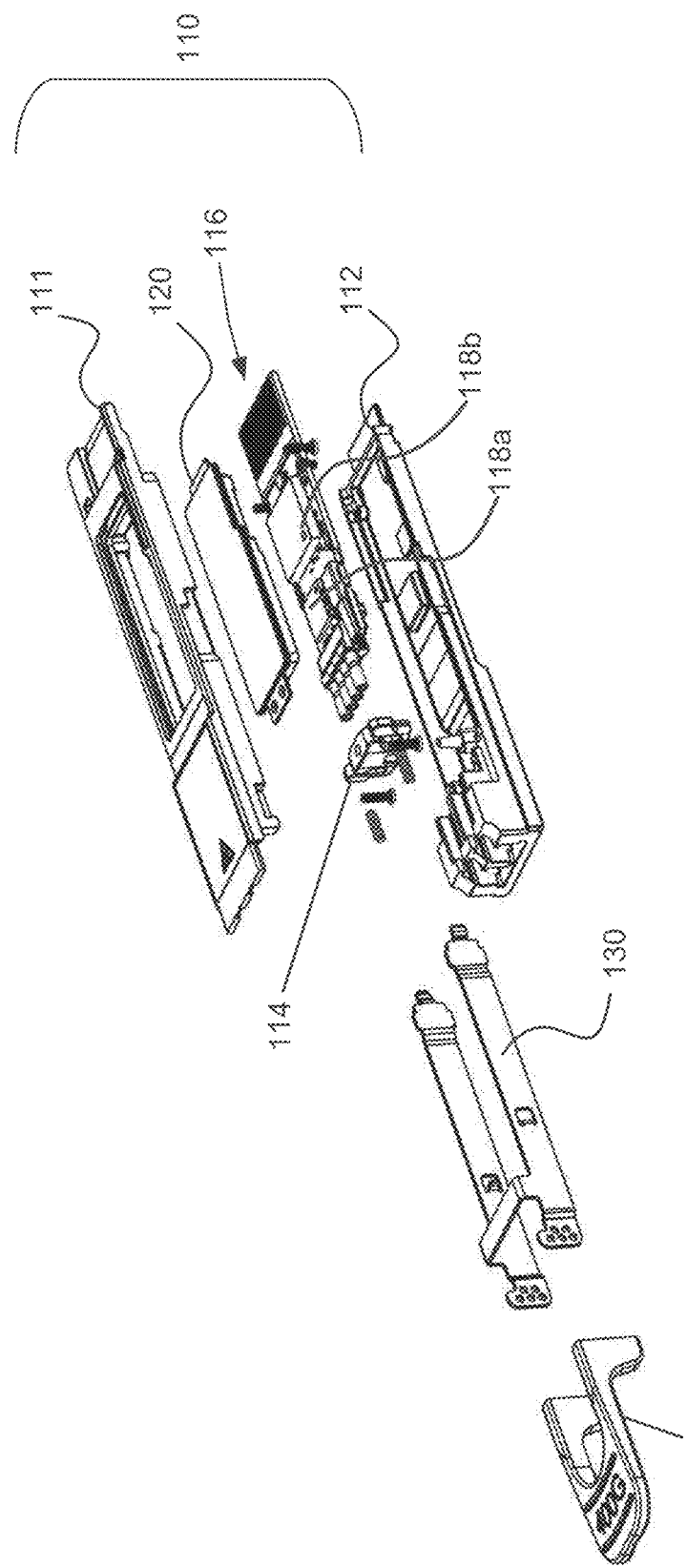
FIG. 1B is an exploded view of the pluggable optical transceiver module shown in FIG. 1A.

One embodiment of a pluggable transceiver module with an integrated vapor chamber is shown in FIGS. 1A and 1B. In the illustrated embodiment, the pluggable transceiver module includes an optical transceiver module 110, a sliding component 130, and a pull handle 132. The optical transceiver module 110 includes transceiver housing portions 111, 112, a fiber holder 114, and transceiver circuitry 116. The housing portions 111, 112 extend along a first major axis 102 from a first end 104 (e.g., an optical connection end) to a second end 106 (e.g., an electrical connection end). The housing portions 111, 112 each generally define about half of the transceiver housing (e.g., top and bottom half). A vapor chamber 120 is integrated with at least one of the transceiver housing portions 111, 112 and is thermally coupled to one or more heat generating components 118 in the transceiver circuitry 116, as will be described in greater detail below.

Although the illustrated embodiments show the vapor chamber 120 integrated with the first housing portion 111, the vapor chamber may also be integrated with the second housing portion 112. A vapor chamber may also be integrated with each of the housing portions 111, 112, and multiple vapor chambers may be integrated with one or both of the housing portions 111, 112.

The transceiver circuitry 116 in the optical transceiver module 110, consistent with embodiments described herein, may include at least a transmitter optical subassembly (TOSA) for transmitting optical signals, a receiver optical subassembly (ROSA) for receiving optical signals, and a circuit board for providing electrical connections to the TOSA and ROSA. The TOSA may include one or more laser diode packages for housing a laser diode and for providing electrical connections and optical couplings to the laser diode. One challenge with the transceiver module 110 is providing thermal management for the heat generating components 118, especially with new optical transceiver modules that are designed to provide higher data rates within a relatively small form factor, as the data center market for optical transceivers continues to grow and demand increases for transmission speeds. Recent standards have now enabled wide-spread development of optical transmitters and transceivers capable of reaching speeds of 400 Gb/s (commonly known as 400 G). Optical transceiver modules continue to scale to meet market demand, but such scaling raises significant design and manufacturing challenges with respect to thermal management. In particular, the heat generated by the laser diode and associated components in the laser package may not be dissipated effectively and thus may adversely affect the laser wavelengths or potentially even damage the laser and/or other components.

Referring to FIG. 1B, the optical transceiver module 110 may include one or more heat generating components 118a, 118b, such as, for example, a laser package, IC components (e.g., DSP, laser driver), TIA or PCB thermal via. The heat generating components may have a power of 12 W or higher. At least a portion of these head generating components 118 may be thermally coupled to a heat input side of the vapor chamber 120.

Figure 2:
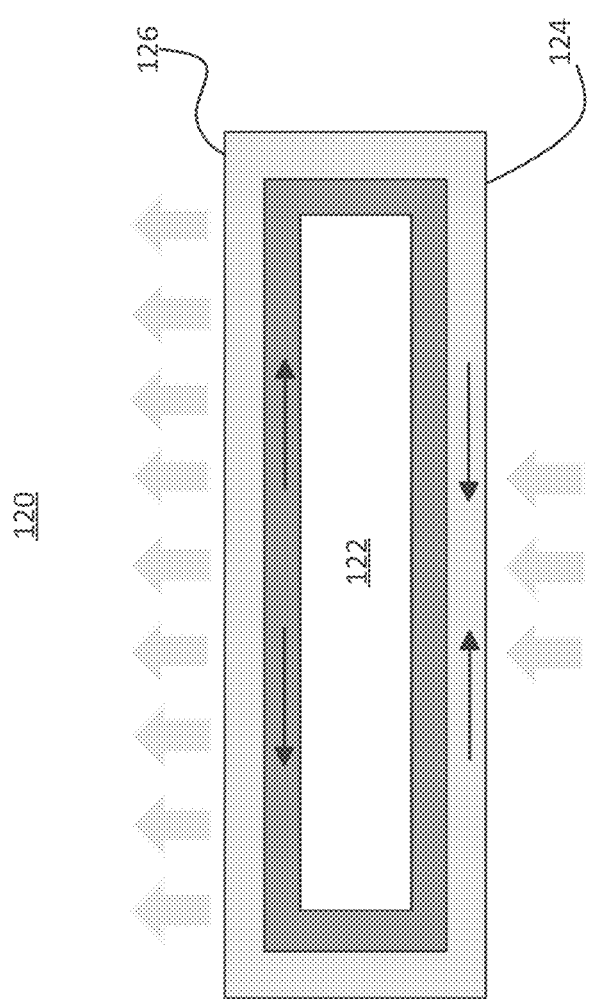
FIG. 2 is a schematic view of an embodiment of a vapor chamber that may be used in the pluggable optical transceiver module shown in FIGS. 1A and 1B.

One example of the vapor chamber 120, which may also be referred to as a planer heat pipe or a vapor chamber heat spreader, is a two-phase device used to spread heat from the heat generating components 118 to outside the transceiver module 110, for example, to a heat sink (not shown in FIGS. 1A and 1B). The vapor chamber 120 can spread heat in two dimensions. Examples of the vapor chamber 120 include the type available from Celsia Inc. or from COFAN USA. As shown in FIG. 2, the vapor chamber 120 includes a working fluid in a chamber region 122 between a heat input side 124 and a heat output side 126. When the vapor chamber 120 is heated (e.g., by heat generating components 118a, 118b inside transceiver module 110) at the heat input side 124 of the vapor chamber 120, the working fluid vaporizes to a gas and travels to cooler areas of the chamber region 122 at the heat output side 126. Absorbing the heat at the heat output side 126 (e.g., by a heat sink) causes the working fluid to condense back to a liquid form and to return to the heat input side 124 of the vapor chamber 120. The vapor chamber 120 may be made out of a thermally conductive material, such as copper, aluminum, and/or titanium.

Figure 3A:
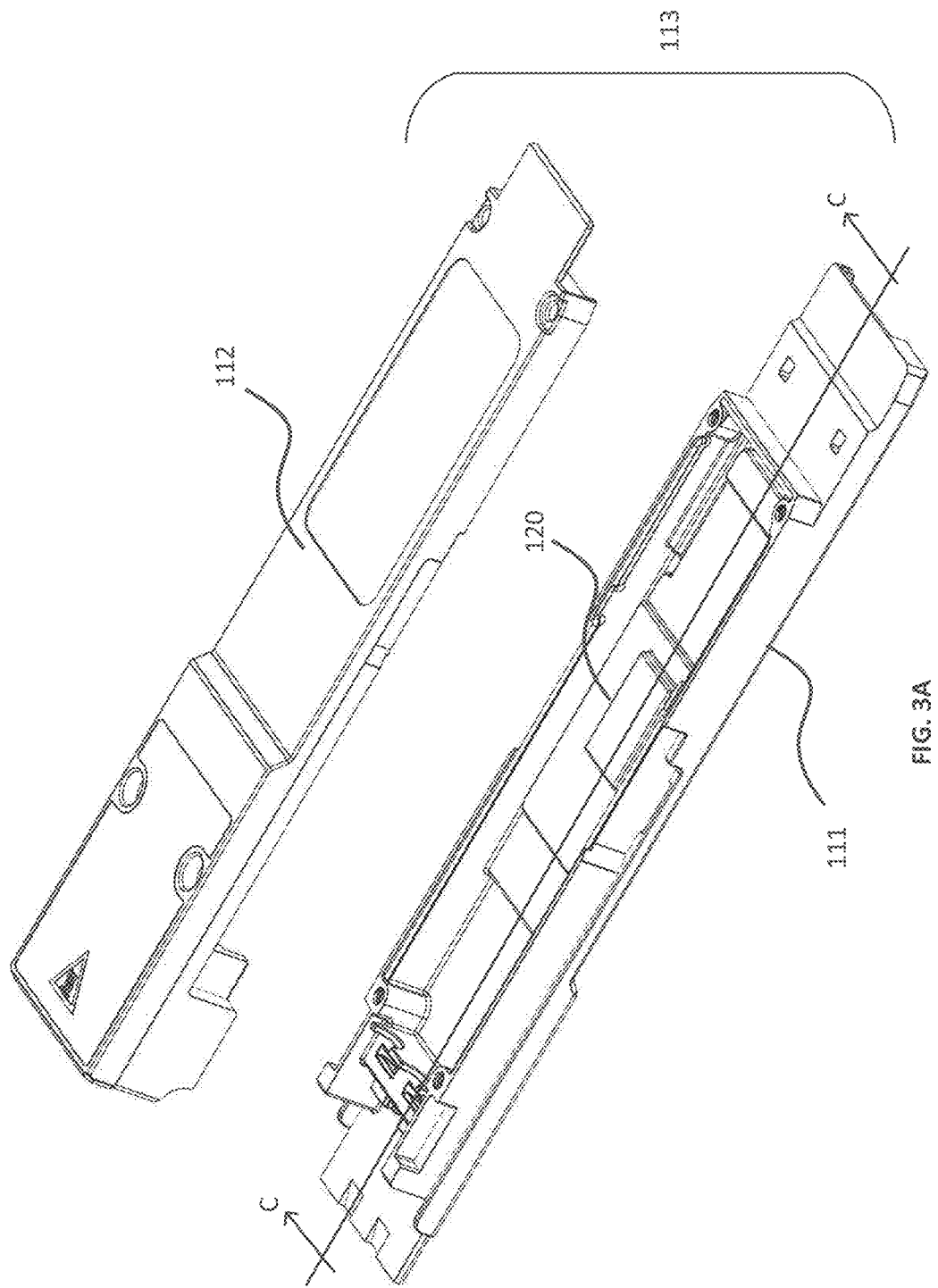
FIG. 3A is an exploded perspective view of a transceiver housing with an integrated vapor chamber, in accordance with an embodiment of the present disclosure.
Figure 3B:
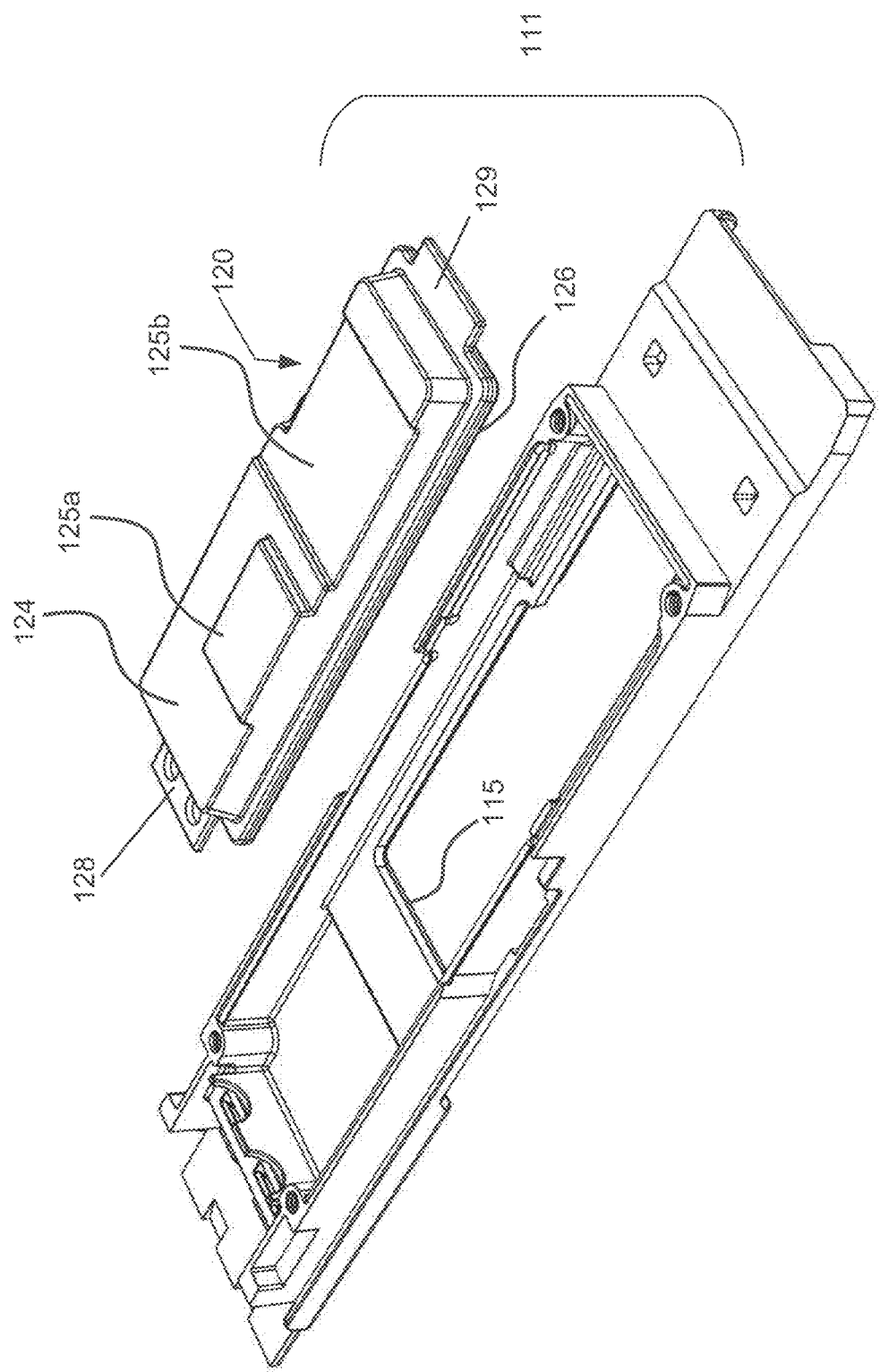
FIG. 3B is an exploded view of a portion of the transceiver housing shown in FIG. 3A with the vapor chamber separated from the transceiver housing.
Figure 3C:
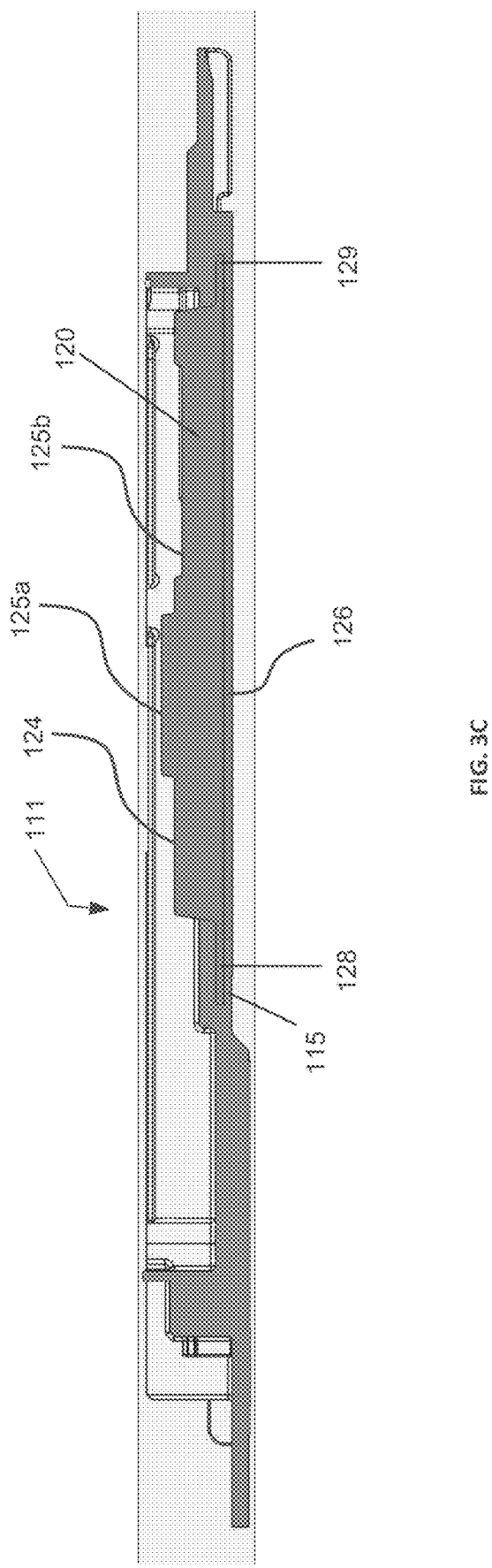
FIG. 3C shows a cross-sectional view taken along line C-C of FIG. 3A of the portion of the transceiver housing with the integrated vapor chamber.

Referring to FIGS. 3A-3C, the transceiver housing including the integrated vapor chamber 120 is described in greater detail. As shown in FIG. 3A, the transceiver housing portions 111, 112 together form a housing body 113 with the vapor chamber 120 integrated into the first housing portion 111. The housing portions 111, 112 are combined to form a compartment defined by one or more inner surfaces therein for housing components of the transceiver module. As shown in FIG. 3C and as will be described in greater detail below, the integrated vapor chamber 120 may be overmolded into the first housing portion 111.

As shown in FIGS. 3B and 3C, the vapor chamber 120 is integrated with the first housing portion 111 such that the heat input side 124 and the heat output side 126 on opposite sides of the vapor chamber 320 are located on the inside and outside, respectively, of the transceiver housing. An outer wall 115 of the first housing portion 111 is defined at least in part by the heat output side 126 of the vapor chamber 120 such that the heat output side 126 of the vapor chamber 120 is exposed to outside of the housing body 113, as shown in FIG. 3C. In one embodiment, the vapor chamber 120 comprises first and second structures, such as extended edge tabs 128, 129, at opposite ends of the vapor chamber 120 to facilitate overmolding of the vapor chamber 120 into the first housing portion 111, as described in greater detail below. The overmolding results in the edge tabs 128, 129 being embedded into part of the housing portion 111, as shown in FIG. 3C.

In the illustrated embodiment, the heat input side 124 of the vapor chamber includes heat transfer regions 125a, 125b having different elevations for positioning proximate and thermally coupling to heat generating components having different elevations in the optical transceiver module. The heat transfer regions 125a, 125b may also have a surface area corresponding to the surface area of the respective heat generating components to facilitate thermal coupling and heat transfer.

In the illustrated embodiment, the heat output side 126 of the vapor chamber 120 forms only a portion of the outer wall 115 of the first housing portion 111. The portion of the outer wall 115 with the heat output side 126 of the vapor chamber 120 may have the same flatness and/or roughness as an adjacent portion of the outer wall 115 as shown in FIG. 3C. The heat output side 126 is exposed to outside of the transceiver housing and the outer wall 115 keeps the same flatness and/or roughness, such that the transceiver housing is able to be efficiently thermally coupled with a heat sink, as discussed in greater detail below.

According to one method, the housing portion 111 may be die-cast with the vapor chamber 120 overmolded with the housing portion 111. The edge tabs 128, 129 of the vapor chamber 120 maybe customized (e.g., with one or more holes) to fix the position of the vapor chamber 120 in a die or overmold tooling. With the vapor chamber 120 fixed in the die or overmold tooling, the material used to form the housing portion 111 is forced into a cavity formed by the die and around the edge tabs 129, 129 of the vapor chamber 120 to form the housing portion 111. The housing portion 111 with integrated vapor chamber 120 may then be removed from the die or tooling. Post die-cast machining may be performed on the outer wall 115 of the housing portion 111, as needed, to meet flatness/roughness specifications.

Other methods may also be used to integrate the vapor chamber 120 with the housing portion 111 including, for example, solder or fasteners. According to these methods, the housing portion 111 may be formed separately, and the vapor chamber 120 may be attached to the separately-formed housing portion 111.

Figure 4A:
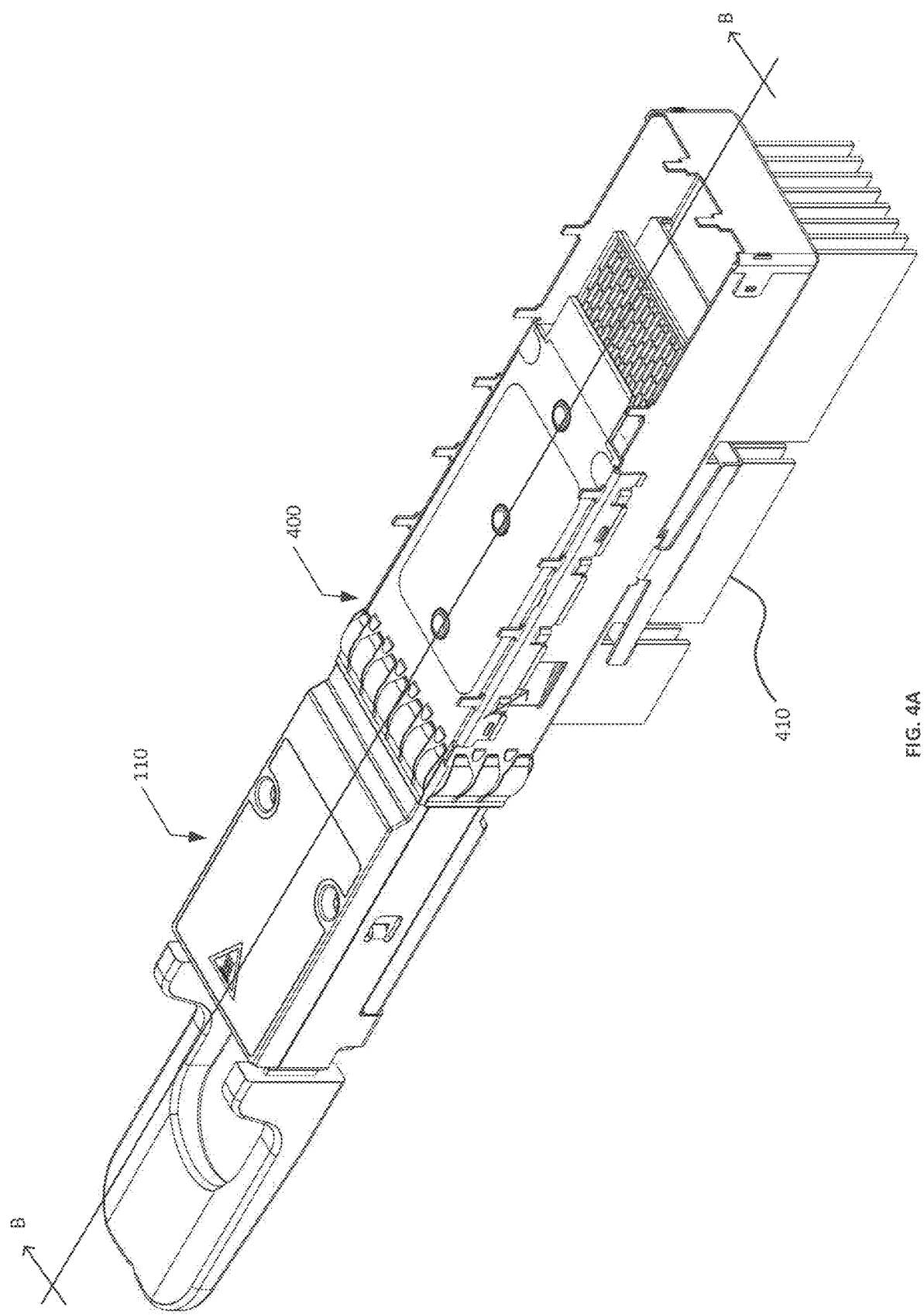
FIG. 4A is a perspective view of a pluggable optical transceiver module with an integrated vapor chamber inserted into a transceiver cage with a heat sink, in accordance with an embodiment of the present disclosure.
Figure 4B:
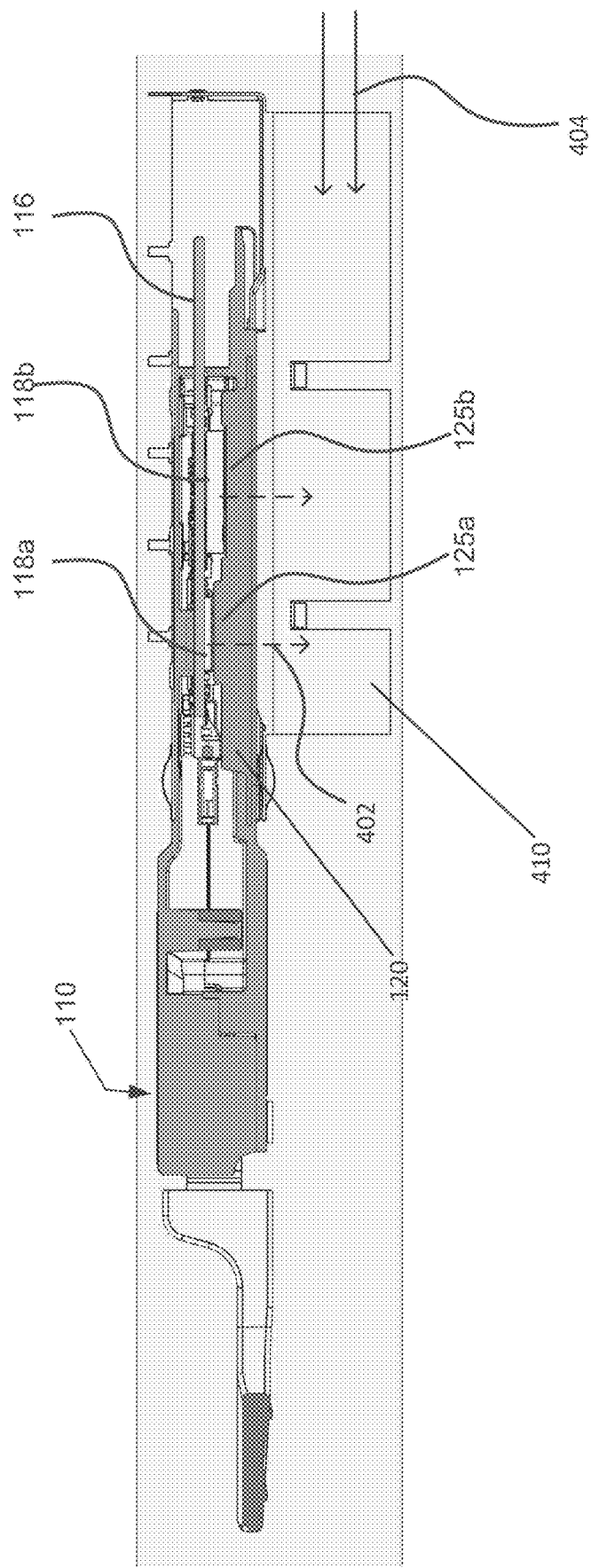
FIG. 4B shows a cross-sectional view taken along line B-B in FIG. 4A of the transceiver module inserted into the transceiver cage with the heat sink.

Referring to FIG. 4A and FIG. 4B, the optical transceiver module 110 is configured to be inserted into a transceiver cage 400 with a heatsink 410. When inserted, the heat output side 126 of the vapor chamber 120 is thermally coupled with the transceiver cage 400 and/or the heatsink 410 to dissipate heat and provide improved thermal characteristics. In one example, the exposed heat output side 126 of the vapor chamber 120 is directly thermally coupled to the heat sink 410. When the vapor chamber 120 is heated by the heat generating components 118a, 118b of the transceiver circuitry 116, the vapor chamber 120 transfers the heat, as indicated by arrows 402, from the heat generating components 118a, 118b to the heat sink 410. Air flows through the heat sink 410, as indicated by arrows 404, for cooling the heat sink 410. In one example, the thermal conductivity of the integrated vapor chamber 120 may be in the range of about 5,000 to 100,000 W/m*K, as compared to the thermal conductivity of a die-cast zinc alloy of about 120 W/m*K.

Accordingly, an optical transceiver housing with an integrated vapor chamber may provide a significantly improved heat transfer from inside an optical transceiver, for example, to meet the thermal management demands of 400 G optical transceivers.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transceiver housing, comprising
a housing body including at least first and second housing portions on opposite sides of the housing body and extending along a first major axis from a first end to a second end, and forming a compartment defined by one or more inner surfaces therein; and
at least one integrated vapor chamber integrated with at least one of the housing portions, the integrated vapor chamber including a heat input side and a heat output side on opposite sides of the vapor chamber, wherein the vapor chamber includes at least one edge tab overmolded into the first housing portion such that the at least one edge tab is embedded in the first housing portion; and
wherein an outer wall of at least one of the housing portions is defined at least in part by the heat output side of the vapor chamber such that the heat output side is exposed to outside the housing body, and wherein the heat input side of the vapor chamber includes a plurality of heat transfer regions having different elevations such that each of the plurality of heat transfer regions on the heat input side are positioned proximate respective heat generating components having different heights inside the transceiver housing.

2. The transceiver housing of claim 1, wherein the heat output side of the vapor chamber forms only a portion of the outer wall of the first housing portion.

3. The transceiver housing of claim 2, wherein the outer wall of the first housing portion, including the heat output side of the first vapor chamber, has a consistent flatness and/or roughness.

4. The transceiver housing of claim 1, wherein the vapor chamber includes edge tabs at each end overmolded into the first housing portion.

5. The transceiver housing of claim 1, wherein the vapor chamber is made of at least one heat conducting material selected from the group consisting of copper, aluminum and titanium.

6. The transceiver housing of claim 1, wherein each of the plurality of heat transfer regions have a surface area corresponding to the respective heat generating components.

7. The transceiver housing of claim 1, wherein the vapor chamber includes a working fluid and is configured to transfer heat from the heat input side to the working fluid to vaporize the working fluid and to transfer heat from the working fluid to the heat output side to condense the working fluid.

8. An optical transceiver module, comprising:
a transceiver housing, including a transceiver optical connection end and a transceiver electrical connection end, the transceiver optical connection end of the transceiver housing being configured to provide an optical connection and the transceiver electrical connection end of the transceiver housing being configured to provide an electrical connection;
a transmitter optical subassembly (TOSA) located in the transceiver housing, the TOSA being configured to transmit optical signals;
a receiver optical subassembly (ROSA) located in the transceiver housing, the ROSA being configured to receive optical signals; and
a circuit board located in the transceiver housing and electrically connected to the TOSA and to the ROSA;
wherein the transceiver housing including at least first and second housing portions on opposite sides of the transceiver housing and extending along a first major axis from a first end to a second end, and forming a compartment defined by one or more inner surfaces therein, and at least one vapor chamber integrated with at least one of the first and second housing portions such that a heat input side of the vapor chamber is thermally coupled to at least one heat generating component inside the transceiver housing and a heat output side of the vapor chamber is exposed to outside the transceiver housing, wherein the vapor chamber includes at least one edge tab overmolded into the first housing portion such that the at least one edge tab is embedded in the first housing portion, wherein an outer wall of at least one of the housing portions is defined at least in part by the heat output side of the vapor chamber, and wherein the heat input side of the vapor chamber includes a plurality of heat transfer regions having different elevations such that each of the plurality of heat transfer regions on the heat input side are positioned proximate respective heat generating components having different heights inside the transceiver housing.

9. The optical transceiver module of claim 8, wherein the heat output side of the vapor chamber forms only a portion of an outer wall of the first housing portion.

10. The optical transceiver module of claim 8, wherein the vapor chamber is made of at least one heat conducting material selected from the group consisting of copper, aluminum and titanium.

11. The optical transceiver module of claim 8, wherein each of the plurality of heat transfer regions have a surface area corresponding to the respective heat generating components.

12. The optical transceiver module of claim 8, further comprising a heatsink coupled to the transceiver housing and thermally coupled to the heat output side of the vapor chamber.

13. The optical transceiver module of claim 8, wherein the vapor chamber includes a working fluid and is configured to transfer heat from the heat input side to the working fluid to vaporize the working fluid and to transfer heat from the working fluid to the heat output side to condense the working fluid.

* * * * *